United States Patent
Toyoshima et al.

(10) Patent No.: US 12,256,579 B2
(45) Date of Patent: Mar. 18, 2025

(54) PHOSPHOR, METHOD OF PRODUCING PHOSPHOR, LIGHT-EMITTING ELEMENT, LIGHT-EMITTING DEVICE, AND IMAGE DISPLAY APPARATUS

(71) Applicant: DENKA COMPANY LIMITED, Tokyo (JP)

(72) Inventors: Hiroaki Toyoshima, Tokyo (JP); Mitsuru Kawagoe, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 659 days.

(21) Appl. No.: 17/621,050

(22) PCT Filed: Jun. 18, 2020

(86) PCT No.: PCT/JP2020/024014
§ 371 (c)(1),
(2) Date: Dec. 20, 2021

(87) PCT Pub. No.: WO2020/262200
PCT Pub. Date: Dec. 30, 2020

(65) Prior Publication Data
US 2022/0367760 A1 Nov. 17, 2022

(30) Foreign Application Priority Data
Jun. 26, 2019 (JP) ................................. 2019-118166

(51) Int. Cl.
| H10H 20/851 | (2025.01) |
| C09K 11/62 | (2006.01) |
| C09K 11/63 | (2006.01) |
| C09K 11/64 | (2006.01) |
| C09K 11/77 | (2006.01) |

(52) U.S. Cl.
CPC ......... *H10H 20/8512* (2025.01); *C09K 11/62* (2013.01); *C09K 11/63* (2013.01); *C09K 11/645* (2013.01); *C09K 11/77346* (2021.01)

(58) Field of Classification Search
CPC . C09K 11/77346; C09K 11/645; C09K 11/63; C09K 11/62; H01L 33/502
See application file for complete search history.

(56) References Cited

U.S. PATENT DOCUMENTS

| 7,544,310 | B2 | 6/2009 | Hirosaki |
| 7,678,294 | B2 | 3/2010 | Hirosaki |
| 7,780,872 | B2 | 8/2010 | Hirosaki |
| 7,846,351 | B2 | 12/2010 | Hirosaki |
| 8,147,715 | B2 | 4/2012 | Hirosaki |
| 8,628,687 | B2 | 1/2014 | Yamao et al. |
| 8,765,015 | B2 | 7/2014 | Hirosaki |
| 9,546,319 | B2 | 1/2017 | Schmidt et al. |
| 10,479,936 | B2 | 11/2019 | Seibald et al. |
| 10,505,080 | B2 | 12/2019 | Seibald et al. |
| 10,519,371 | B2 | 12/2019 | Seibald et al. |
| 10,644,206 | B2 | 5/2020 | Seibald et al. |
| 10,711,192 | B2 | 7/2020 | Seibald et al. |
| 11,230,664 | B2 | 1/2022 | Baumann et al. |
| 11,279,876 | B2 * | 3/2022 | Toyoshima ............. C01F 11/02 |
| 11,447,695 | B2 | 9/2022 | Stoll et al. |
| 11,453,822 | B2 | 9/2022 | Seibald et al. |
| 2007/0108896 | A1 | 5/2007 | Hirosaki |
| 2009/0129052 | A1 | 5/2009 | Hirosaki |
| 2009/0153028 | A1 | 6/2009 | Hirosaki |
| 2009/0236969 | A1 | 9/2009 | Hirosaki |
| 2009/0284948 | A1 | 11/2009 | Yamao et al. |
| 2011/0121234 | A1 | 5/2011 | Hirosaki |
| 2012/0176568 | A1 | 7/2012 | Hirosaki |
| 2013/0001815 | A1 | 1/2013 | Yamao et al. |
| 2015/0123155 | A1 | 5/2015 | Schmidt et al. |
| 2016/0024379 | A1 | 1/2016 | Iwashita et al. |
| 2019/0093011 | A1 | 3/2019 | Seibald et al. |
| 2019/0144744 | A1 | 5/2019 | Seibald et al. |
| 2019/0144745 | A1 | 5/2019 | Seibald et al. |
| 2019/0157520 | A1 | 5/2019 | Seibald et al. |
| 2019/0316035 | A1 | 10/2019 | Seibald et al. |
| 2019/0322934 | A1 | 10/2019 | Seibald et al. |
| 2019/0326481 | A1 | 10/2019 | Seibald et al. |
| 2020/0245428 | A1 | 7/2020 | Baumann et al. |
| 2020/0347293 | A1 | 11/2020 | Stoll et al. |
| 2021/0002549 | A1 | 1/2021 | Seibald et al. |
| 2021/0017448 | A1 | 1/2021 | Toyoshima et al. |
| 2021/0238477 | A1 | 8/2021 | Butendeich et al. |
| 2022/0315836 | A1 | 10/2022 | Seibald et al. |

FOREIGN PATENT DOCUMENTS

| CN | 105400513 | * | 3/2016 |
| CN | 105400513 | A | 3/2016 |
| CN | 109804047 | A | 5/2019 |
| CN | 111902516 | A | 11/2020 |
| JP | 2005-255895 | A | 9/2005 |
| JP | 2015-526532 | A | 9/2015 |
| TW | 201443200 | A | 11/2014 |
| WO | 2006/101096 | A1 | 9/2006 |
| WO | 2007/066733 | A1 | 6/2007 |
| WO | 2008/004640 | A1 | 1/2008 |
| WO | 2019/188319 | A1 | 10/2019 |

OTHER PUBLICATIONS

Translation for CN 105400513, Mar. 16, 2016.*

(Continued)

*Primary Examiner* — C Melissa Koslow
(74) *Attorney, Agent, or Firm* — Oliff PLC

(57) ABSTRACT

A phosphor in which at least some of an element M in a phosphor host crystal represented by $M_\alpha(L, A)_\beta X_\gamma$ is substituted with Eu as an activation material. M represents one or more (including at least Sr) of Mg, Ca, Sr, Ba, and Zn, L represents one or more of Li, Na, and K, A represents one or more of Al, Ga, B, In, Sc, Y, La, and Si, X represents one or more (except that X represents only N) of O, N, F, and Cl, $\alpha$, $\beta$, $\gamma$, and $\delta$ satisfy $8.70 \le \alpha+\beta+\gamma+\delta \le 9.30$, $0.00 < \alpha \le 1.30$, $3.70 \le \beta \le 4.30$, $3.70 \le \gamma \le 4.30$, and $0.00 < \delta \le 1.30$. In a fluorescence spectrum obtained by irradiation with light having a wavelength of 260 nm, when a fluorescence intensity at a wavelength of 569 nm is represented by $I_0$ and a fluorescence intensity at a wavelength of 617 nm is represented by $I_1$, $I_1/I_0$ is 0.01 or more and 0.4 or less.

11 Claims, 4 Drawing Sheets

(56) References Cited

OTHER PUBLICATIONS

Partial Translation of Yu Xianen; "Fluorescence Mechanics—Study of Photoluminescence Mechanism"; Practical Luminescent Materials, 2nd Edition; Chine Light Industry Publishing House Society; 2008; pp. 172-174.

Partial Translation of Yu Maoquan et al.; "New Progress in Research and Application of Inorganic Luminescent Materials"; China Science and Technology University Press; 2010; pp. 24-25.

Pust, Philipp et al., "Narrow-Band Red-Emitting Sr[LiAl3N4]:Eu2+ As a Next-Generation LED-Phosphor Material", Nature Materials, vol. 13, Sep. 2014, url: www.nature.com/naturematerials, pp. 891-896.

Sep. 8, 2020 Search Report issued in International Patent Application No. PCT/JP2020/024014.

Jan. 9, 2023 Office Action issued in Chinese Patent Application No. 202080045881.2.

Oct. 17, 2023 Office Action and Search Report issued in Taiwanese Patent Application No. 109120976.

\* cited by examiner

PHOSPHOR, METHOD OF PRODUCING PHOSPHOR, LIGHT-EMITTING ELEMENT, LIGHT-EMITTING DEVICE, AND IMAGE DISPLAY APPARATUS

TECHNICAL FIELD

The present invention relates to a phosphor, a method of producing a phosphor, a light-emitting element, a light-emitting device, and an image display apparatus.

BACKGROUND ART

The phosphor is used for, for example, a vacuum-fluorescent display (VFD), a field emission display (FED) or a surface-conduction electron-emitter display (SED), a plasma display panel (PDP), a cathode-ray tube (CRT), a light-emitting diode (LED), or a liquid-crystal display backlight. In particular, a white LED which is a combination of a near ultraviolet or blue semiconductor light-emitting element and a phosphor is generally used for a liquid crystal display or a lighting apparatus.

Recently, for the LED for the liquid crystal display or the lighting apparatus, high color reproducibility is strongly required. To that end, it is desirable that a phosphor having a full width at half maximum as narrow as possible for example, for the white LED for the liquid crystal display, a green phosphor or red phosphor having a narrow full width at half maximum is required, and a narrow band green phosphor or narrow band red phosphor having a narrow full width at half maximum that satisfies the requirement has been recently reported. In addition, for the white LED for the lighting apparatus where high brightness is required, a narrow band yellow phosphor having a narrow full width at half maximum is required.

As an example of the narrow band green phosphor, a green phosphor in which β-sialon is used as a host crystal and activated with Eu, that is, a β-sialon phosphor is known (refer to Patent Document 1; in the present specification, a crystal such as β-sialon will be referred to as a "phosphor host crystal," or will also be simply referred to as a "host crystal"). It is known that, in the β-sialon phosphor, by changing the oxygen content while maintaining the crystal structure, an emission peak wavelength changes toward a shorter wavelength side (for example, refer to Patent Document 2). In addition, it is known that, by activating β-sialon with Ce, the β-sialon becomes a blue phosphor (for example, refer to Patent Document 3). In addition, as an example of the narrow band red phosphor, a phosphor in which $SrLiAl_3N_4$ is used as a phosphor host crystal and activated with Eu is known (refer to Non-Patent Document 1).

Here, an element such as Eu or Ce that controls light emission will be referred to as "activation element". In general, the activation element is present in a phosphor in an ionic state and in a state where it is substituted with some element in a phosphor host crystal.

The emission color of the phosphor is determined depending on a combination of the phosphor host crystal and the activation element which is substituted with the phosphor host crystal. Further, emission characteristics such as an emission spectrum or an excitation spectrum, chemical stability, or thermal stability are determined depending on a combination of the phosphor host crystal and the activation element. Therefore, when phosphor host crystals are different or when activation elements are different, phosphors are considered to be different. In addition, when phosphors have the same chemical composition but different crystal structures of phosphor host crystals, the phosphors are different in emission characteristics or chemical stability and thus are considered to be different.

On the other hand, in many phosphors, while maintaining the crystal structure of the phosphor host crystal, some or all of constituent elements can be substituted with different elements, and thus the emission color can be changed. For example, in general, a phosphor in which Ce is substituted with a host crystal of a YAG crystal emits green light, but a phosphor in which some of Y is substituted with Gd and some of Al is substituted with Ga in a YAG crystal emits yellow light. In addition, it is known that, in a phosphor in which Eu is substituted with a phosphor host crystal represented by $CaAlSiN_3$, by substituting some of Ca with Sr, the composition can be changed while maintaining the crystal structure, and the emission peak wavelength can be shortened.

RELATED DOCUMENT

Patent Document

[Patent Document 1] Japanese Unexamined Patent Publication No. 2005-255895
[Patent Document 2] Pamphlet of International Publication No. WO2007/066733
[Patent Document 3] Pamphlet of International Publication No. WO2006/101096

Non-Patent Document

[Non-Patent Document 1] NATURE MATERIALS, VOL. 13, September 2014

SUMMARY OF THE INVENTION

Recently, a requirement for higher brightness of a LED has increased, and further improvement for emission (fluorescence) characteristics of a phosphor is expected.

According to the present invention, there is provided a phosphor in which at least some of an element M in a phosphor host crystal represented by $M_\alpha(L, A)_\beta X_\gamma$ is substituted with Eu as an activation material, the phosphor having a composition represented by Formula: $M_\alpha(L, A)_\beta X_\gamma:Eu_\delta$, in which M represents one or more elements (including at least Sr) selected from Mg, Ca, Sr, Ba, and Zn, L represents one or more elements selected from Li, Na, and K, A represents one or more elements selected from Al, Ga, B, In, Sc, Y, La, and Si, X represents one or more elements (except that X represents only N) selected from O, N, F, and Cl, α, β, γ, and δ satisfy $8.70 \leq \alpha+\beta+\gamma+\delta \leq 9.30$, $0.00 < \alpha \leq 1.30$, $3.70 \leq \beta \leq 4.30$, $3.70 \leq \gamma \leq 4.30$, and $0.00 < \delta \leq 1.30$, and in a fluorescence spectrum obtained by irradiation with light having a wavelength of 260 nm, when a fluorescence intensity at a wavelength of 569 nm is represented by I0 and a fluorescence intensity at a wavelength of 617 nm is represented by $I_1$, a fluorescence intensity ratio $I_1/I_0$ is 0.01 or more and 0.4 or less.

In addition, according to the present invention, there is provided a method of producing a phosphor having a composition including at least one element M selected from the group consisting of Mg, Ca, Sr, Ba, and Zn, at least one element L selected from the group consisting of Li, Na, and K, at least one element A selected from the group consisting of Al, Ga, B, In, Sc, Y, La, and Si, at least one element X (except that X represents only N) selected from the group consisting of O, N, F, and Cl, and Eu, the method including:

a mixing step of obtaining a raw material mixture including respective elements forming the composition; and a firing step of firing the raw material mixture such that at least some of $Eu^{3+}$ in the raw material mixture is reduced into $Eu^{2+}$, in a fluorescence spectrum obtained by irradiation with light having a wavelength of 260 nm, when a fluorescence intensity at a wavelength of 569 nm is represented by I0 and a fluorescence intensity at a wavelength of 617 nm is represented by $I_1$, a fluorescence intensity ratio $I_1/I_0$ is 0.01 or more and 0.4 or less.

In addition, according to the present invention, there is provided a light-emitting element including the above-described phosphor.

In addition, according to the present invention, there is provided a light-emitting device including the above-described light-emitting element.

In addition, according to the present invention, there is provided an image display apparatus including the above-described light-emitting element.

According to the present invention, a technique relating to a phosphor having improved emission characteristics can be provided.

DESCRIPTION OF EMBODIMENTS

Figure 1:
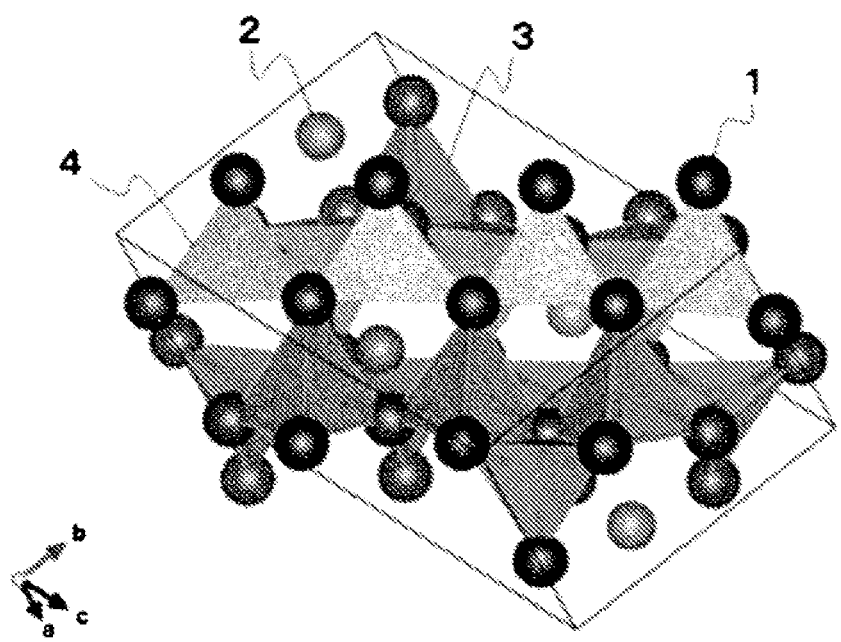
FIG. 1 is a diagram showing a crystal structure of $SrLi_3AlO_4$ crystal.

Hereinafter, an embodiment of the present invention will be described in detail. In the present specification, the expression "a to b" in the description of a numerical range represents a or more and b or less unless specified otherwise.

<1. Phosphor>

A phosphor according to the embodiment is an Eu-activated phosphor in which at least some of an element M in a phosphor host crystal represented by $M_\alpha(L, A)_\beta X_\gamma$ is substituted with Eu as an activation material.

The phosphor has a composition represented by Formula:

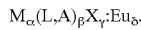

In the formula,

M represents one or more elements selected from Mg, Ca, Sr, Ba, and Zn,

L represents one or more elements selected from Li, Na, and K,

A represents one or more elements selected from Al, Ga, B, In, Sc, Y, La, and Si, X represents one or more elements (except that X represents only N) selected from O, N, F, and Cl, α, β, γ, and δ satisfy $8.70 \leq \alpha+\beta+\gamma \leq 9.30$, $0.00 < \alpha \leq 1.30$, $3.70 \leq \beta \leq 4.30$, $3.70 \leq \gamma \leq 4.30$, and $0.00 < \delta \leq 1.30$.

The phosphor according to the embodiment is configured such that, by irradiation with light having a wavelength of 260 nm, when a fluorescence intensity at a wavelength of 569 nm is represented by $I_0$ and a fluorescence intensity at a wavelength of 617 nm is represented by $I_1$, a fluorescence intensity ratio $I_1/I_0$ is 0.01 or more and 0.4 or less.

According to the findings by the present inventors, it was found that, when a reduction process during the synthesis of a phosphor is insufficient, the emission intensity of $Eu^{3+}$ tends to increase such that emission characteristics such as an internal quantum efficiency, an external quantum efficiency, or an absorptivity decrease.

On the other hand, it was found that, by appropriately performing the reduction process in the process of the synthesis, the emission characteristics can be improved. At this time, while the emission intensity of $Eu^{3+}$ decreases, the fluorescence intensity as the emission intensity of $Eu^{2+}$ increases. Therefore, it was considered that, by using a fluorescence intensity ratio the emission intensity of $Eu^{3+}$/ the emission intensity of $Eu^{2+}$ as an index, the degree of the reduction process of the phosphor can be evaluated.

As a result of further investigation, it was found that, by using the fluorescence intensity ratio $I_1/I_0$ as an index and adjusting $I_1/I_0$ to be in the above-described range, the emission characteristics of the phosphor such as an internal quantum efficiency, an external quantum efficiency, or an absorptivity can be improved.

The detailed mechanism is not clear but is presumed to be that, an increase in the emission intensity of $Eu^{3+}$ is suppressed, an increase in the emission intensity of $Eu^{2+}$ is relatively promoted, and an abundance ratio of $Eu^{2+}$ to $Eu^{3+}$ increases such that emission characteristics such as an internal quantum efficiency, an external quantum efficiency, or an absorptivity can be improved.

By adopting fluorescence having a wavelength of 569 nm as an index for emitted light derived from $Eu^{2+}$ and adopting fluorescence having a wavelength of 617 nm as an index for emitted light derived from $Eu^{3+}$, the stable evaluation can be performed. Examples of the emitted light derived from $Eu^{3+}$ include fluorescence having a wavelength of 617 nm, fluorescence having a wavelength of 628 nm, fluorescence having a wavelength of 656 nm, and fluorescence having a wavelength of 708 nm. However, the detection sensitivity of the fluorescence having a wavelength of 656 nm and the fluorescence having a wavelength of 708 nm is low. Therefore, there is a concern that the evaluation may fluctuate.

The upper limit of the fluorescence intensity ratio $I_1/I_0$ is 0.40 or less, preferably 0.35 or less, and more preferably 0.30 or less. As a result, the emission characteristics of the phosphor can be improved. On the other hand, the lower limit of the fluorescence intensity ratio $I_1/I_0$ is not particularly limited and may be, for example, 0.01 or more.

In the phosphor according to the embodiment, by allowing the phosphor host crystal to have the composition and the crystal structure described above and adjusting the fluorescence intensity ratio $I_1/I_0$ to be 0.4 or less, the fluorescence characteristics can be improved.

In the phosphor according to the embodiment, by irradiation with light having a wavelength of 260 nm, when an emission intensity at a wavelength of 628 nm is represented by $I_2$, a fluorescence intensity ratio $I_2/I_0$ is preferably 0.01 or more and 0.3 or less.

The upper limit of the fluorescence intensity ratio $I_2/I_0$ is 0.30 or less, preferably 0.25 or less, and more preferably 0.20 or less. On the other hand, the lower limit of the fluorescence intensity ratio $I_2/I_0$ is not particularly limited and may be, for example, 0.01 or more.

By adjusting the fluorescence intensity ratio $I_1/I_0$ to be 0.4 or less and adjusting the fluorescence intensity ratio $I_2/I_0$ to be 0.3 or less, the phosphor host crystal can be allowed to have the composition and the crystal structure described above, and fluorescence characteristics can be further improved.

In the process of completing the present invention, the present inventors synthesized a material represented by a compositional formula $SrLi_3AlO_4$ from raw materials including Sr, Li, Al, and O, conducted a thorough investigation on the synthetic material, and found through the analysis of the crystal structure that the synthetic material is not a mixture but a single compound having a crystal structure that has $SrLi_3AlO_4$ as a unit and is not yet reported before the present invention. In addition, it was found that, even after some or all of an element in the $SrLi_3AlO_4$ crystal is substituted with another specific element, the same crystal structure as that of the $SrLi_3AlO_4$ crystal can be maintained. In summary, it was also found that the crystal is a crystal represented by a compositional formula of $M_\alpha(L, A)_\beta X_\gamma$ where the symbols M, L, A, and X are used (where, M represents one or more elements selected from Mg, Ca, Sr, Ba, and Zn, L represents one or more elements selected from Li, Na, and K, A represents one or more elements selected from Al, Ga, B, In, Sc, Y, La, and Si, X represents one or more elements (except that X represents only N) selected from O, N, F, and Cl).

In the crystal having the composition represented by Formula: $M_\alpha(L, A)_\beta X_\gamma:Eu_\delta$ in which at least some of the element M in the $M_\alpha(L, A)_\beta X_\gamma$ crystal is substituted with Eu (where $\alpha$, $\beta$, $\gamma$, and $\delta$ satisfy $8.70 \leq \alpha+\beta+\gamma+\delta \leq 9.30$, and $\delta$ satisfies $0.00<\delta \leq 1.30$), in both $Eu^{3+}$ and $Eu^{2+}$ states, the same crystal structure as that of the $M_\alpha(L, A)_\beta X_\gamma$ crystal can also be maintained, and the crystal emits fluorescence. Therefore, it was found that the crystal represented by the compositional formula $M_\alpha(L, A)_\beta X_\gamma$ can be a new phosphor host crystal. That is, a new phosphor in which at least some of the element M in the phosphor host crystal represented by the compositional formula $M_\alpha(L, A)_\beta X_\gamma$ is substituted with Eu was found, and thus present invention was completed.

Table 1 shows the result of the X-ray crystal structure analysis regarding the $SrLi_3AlO_4$ crystal that triggered the completion of the present invention. A method of producing the $SrLi_3AlO_4$ crystal will be described below.

TABLE 1

| Crystal Composition | | $SrLi_3AlO_4$ | |
|---|---|---|---|
| Formula Weight (Z) | | 4 | |
| Crystal System | | Triclinic System | |
| Space Group | | P-1 | |
| Space Group Number | | 2 | |
| Lattice Constant | a | 0.5754 | nm |
| | b | 0.7344 | nm |
| | c | 0.9743 | nm |
| | α | 83.931 | deg. |
| | β | 76.692 | deg. |
| | γ | 79.657 | deg. |

| Space of Atom | Atomic Coordinates | | | Occupancy |
|---|---|---|---|---|
| | x | y | z | |
| Sr (1) | 0.0078 | 0.1215 | 0.6180 | 1 |
| Sr (2) | 0.0280 | 0.6333 | 0.1238 | 1 |
| Li, Al (1) | 0.4593 | 0.2880 | 0.6352 | 1 |
| Li, Al (2) | 0.1611 | 0.1951 | 0.1536 | 1 |
| Li, Al (3) | 0.4626 | 0.0674 | 0.3701 | 1 |
| Li, Al (4) | 0.8148 | 0.0555 | 0.1030 | 1 |
| Li, Al (5) | 0.1794 | 0.4394 | 0.4003 | 1 |
| Li, Al (6) | 0.5420 | 0.4516 | 0.1256 | 1 |
| Li, Al (7) | 0.4710 | 0.8137 | 0.1157 | 1 |
| Li (8) | 0.8101 | 0.3233 | 0.3516 | 1 |
| O (1) | 0.6461 | 0.1573 | 0.4939 | 1 |
| O (2) | 0.1590 | 0.1974 | 0.3379 | 1 |
| O (3) | 0.1882 | 0.4281 | 0.5994 | 1 |
| O (4) | 0.3437 | 0.3406 | 0.0345 | 1 |
| O (5) | 0.3329 | 0.1134 | 0.7622 | 1 |
| O (6) | 0.8561 | 0.3109 | 0.1423 | 1 |
| O (7) | 0.3572 | 0.6152 | 0.2748 | 1 |
| O (8) | 0.1723 | 0.9650 | 0.1045 | 1 |

In Table 1, lattice constants a, b, and c represent lengths of axes of unit lattices of the $SrLi_3AlO_4$ crystal, and α, β, and γ represent angles between the axes of the unit lattices. In addition, atomic coordinates x, y, and z in Table 1 represent the position of each of atoms in the unit lattice using values between 0 and 1 in units of unit lattices. In this crystal, atoms of each of Sr, Li, Al, and O were present, and an analysis result where Sr was present in two kinds of the same spaces (Sr(1) and Sr(2)) was obtained. In addition, an analysis result where Li and Al were present in seven kinds of the same spaces (Li, Al(1) to Li, Al(7)) was obtained. An analysis result where Li was present in one kind of the same space (Li(8)) was obtained. Further, an analysis result where O was present in eight kinds of the same spaces was obtained.

FIG. 1 is a diagram showing the crystal structure of the $SrLi_3AlO_4$ crystal. In FIG. 1, 1 represents an O atom positioned at an apex of a tetrahedron. 2 represents a Sr atom positioned between tetrahedrons. 3 represents an $AlO_4$ tetrahedron having an Al atom at the center. 4 represents an $LiO_4$ tetrahedron having a Li atom at the center. That is, the $SrLi_3AlO_4$ crystal belongs to a triclinic system and belongs to a P-1 space group (the second space group of International Tables for Crystallography). Eu as a so-called activation element that functions to emit light is incorporated into the crystal in a form where it is substituted with some of Sr.

The above-described result is not known as well-known technical information before the phosphor according to the present invention is disclosed. That is, the phosphor according to the embodiment in which at least some of the element M in the phosphor host crystal represented by the compositional formula $M_\alpha(L, A)_\beta X_\gamma$ is substituted with Eu is a new phosphor.

Further, in the crystal represented by the compositional formula $M_\alpha(L, A)_\beta X_\gamma$, that is, in the crystal in which some or all of the element in the SrLi$_3$AlO$_4$ crystal is substituted with another element and is further substituted with Eu as an activation element, although the lattice constants of the SrLi$_3$AlO$_4$ crystal shown in Table 1 vary, the basic crystal structure, spaces occupied by atoms, and atom positions given by the coordinates do not change largely to the extent that a chemical bond between backbone atoms breaks, and the crystal structure does not change.

That is, the above-described expression "even after some or all of an element in the SrLi$_3$AlO$_4$ crystal is substituted with another specific element, the same crystal structure as that of the SrLi$_3$AlO$_4$ crystal can be maintained" represents that the crystal represented by the compositional formula M$_\alpha$(L, A)$_\beta$X$_\gamma$ satisfies a condition that the lattice constant obtained by Rietveld analysis of the result of X-ray diffraction or neutron diffraction in the P-1 space group and the length (distance between adjacent atoms) of a chemical bond between Al and O or between Li and O calculated from the atomic coordinates are within ±5% as compared to the length of the chemical bond calculated from the lattice constant and the atomic coordinates of the SrLi$_3$AlO$_4$ crystal shown in Table 1. At this time, it was experimentally verified that, when the length of the chemical bond changes by more than ±5%, the chemical bond breaks such that another crystal is produced.

In the M$_\alpha$(L, A)$_\beta$X$_\gamma$ crystal according to the embodiment, for example, in the SrLi$_3$AlO$_4$ crystal shown in FIG. 1, the element represented by M enters the space where Sr is present, the elements represented by L and A can enter the spaces where Li and Al are present, respectively, and the element represented by X can enter the space where O is present. Based on this regularity, while maintaining the crystal structure of SrLi$_3$AlO$_4$, a ratio in which the total number of atoms of L and A is 4 and the total number of atoms of X is 4 with respect to 1 of M can be obtained. In addition, Eu can enter the space where Sr is present. In this case, it is desirable that the total amount of positive charge of the elements represented by M, L, and A and Eu is canceled out by the total amount of negative charge of the elements represented by X such that the electrical neutrality of the entire crystal is maintained.

Figure 2:
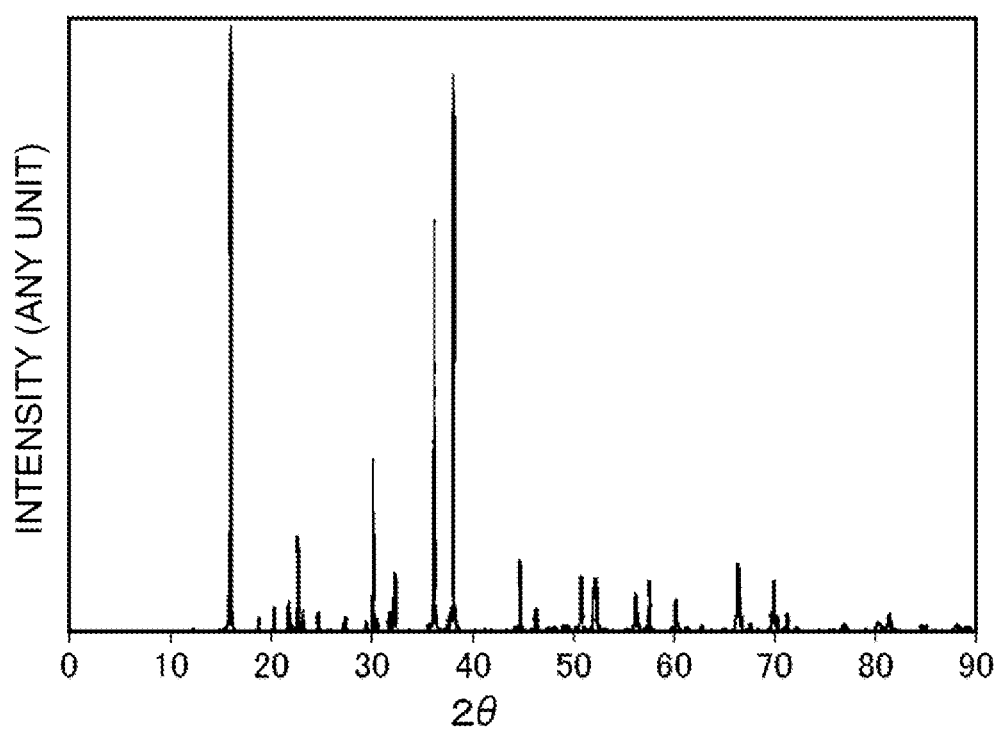
FIG. 2 is a diagram showing powder X-ray diffraction using a CuKα ray calculated from the crystal structure of the $SrLi_3AlO_4$ crystal.

FIG. 2 shows a peak pattern of powder X-ray diffraction using a CuKα ray calculated based on the numerical values shown in Table 1 from the crystal structure of the SrLi$_3$AlO$_4$ crystal.

As a simple method of determining whether or not a crystal having an unknown crystal structure has the same crystal structure as that of the SrLi$_3$AlO$_4$ crystal, the following method can be preferably used. That is, in this method, regarding the crystal having the unknown crystal structure, when a position (2θ) of a measured X-ray diffraction peak and a peak position of diffraction shown in FIG. 2 match each other in major peaks, it is determined that both of the crystal structures are the same. That is, it is determined that the unknown crystal structure of the crystal is the same as that of the SrLi$_3$AlO$_4$ crystal. For the determination, about 10 peaks having a strong diffraction intensity may be used as the major peaks. In the embodiment, this determination method is used in Examples.

As described above, the phosphor according to the embodiment is the phosphor in which the positions of at least some of the element M in the phosphor host crystal represented by M$_\alpha$(L, A)$_\beta$X$_\gamma$ is substituted with Eu. In the phosphor, some or all of L may represent Li, some or all of A may represent one or more elements selected from Al, Ga, and Si, and X may represent one or more elements (except that X represents only N) selected from O and N.

Here, when a raw material including N, that is, a nitride is used for producing a phosphor in the related art, a phosphor derived from the raw material and including a small amount of O is produced. However, in the embodiment, although described below, a phosphor is produced using a raw material including O, that is, an oxide. The production method is not limited to the method of producing a phosphor using only an oxide, and a nitride may be used. However, a phosphor is not produced using only a nitride. Accordingly, all of X in the phosphor host crystal represented by M$_\alpha$(L, A)$_\beta$X$_\gamma$ is not substituted with N.

Regarding the phosphor according to the embodiment, the phosphor host crystal represented by the compositional formula M$_\alpha$(L, A)$_\beta$X$_\gamma$ may be represented by a compositional formula including any combination of the elements. It is preferable that the phosphor host crystal is a phosphor host crystal that is specifically represented by a compositional formula shown below using a parameter p (where 0≤p<2.0). That is, it is preferable that the phosphor host crystal according to the embodiment is represented by, for example, SrLi$_{3-p}$Al$_{1+p}$O$_{4-2p}$N$_{2p}$, MgLi$_{3-p}$Al$_{1+p}$O$_{4-2p}$N$_{2p}$, CaLi$_{3-p}$Al$_{1+p}$O$_{4-2p}$N$_{2p}$, BaLi$_{3-p}$Al$_{1+p}$O$_{4-2p}$N$_{2p}$, ZnLi$_{3-p}$Al$_{1+p}$O$_{4-2p}$N$_{2p}$, (Ca, Mg) Li$_{3-p}$Al$_{1+p}$O$_{4-2p}$N$_{2p}$, (Sr, Ca) Li$_{3-p}$Al$_{1+p}$O$_{4-2p}$N$_{2p}$, (Sr, Ba) Li$_{3-p}$Al$_{1+p}$O$_{4-2p}$N$_{2p}$, SrLi$_{3-p}$Ga$_{1+p}$O$_{4-2p}$N$_{2p}$, MgLi$_{3-p}$Ga$_{1+p}$O$_{4-2p}$N$_{2p}$, CaLi$_{3-p}$Ga$_{1+p}$O$_{4-2p}$N$_{2p}$, BaLi$_{3-p}$Ga$_{1+p}$O$_{4-2p}$N$_{2p}$, ZnLi$_{3-p}$Ga$_{1+p}$O$_{4-2p}$N$_{2p}$, SrLi$_{3-p}$(Al, Ga)$_{1+p}$O$_{4-2p}$N$_{2p}$, MgLi$_{3-p}$(Al, Ga)$_{1+p}$O$_{4-2p}$N$_{2p}$, CaLi$_{3-p}$(Al, Ga)$_{1+p}$O$_{4-2p}$N$_{2p}$, BaLi$_{3-p}$(Al, Ga)$_{1+p}$O$_{4-2p}$N$_{2p}$, ZnLi$_{3-p}$(Al, Ga)$_{1+p}$O$_{4-2p}$N$_{2p}$, SrLi$_{3-p}$(Al, Si)$_{1+p}$O$_{4-2p}$N$_{2p}$, MgLi$_{3-p}$(Al, Si)$_{1+p}$O$_{4-2p}$N$_{2p}$, CaLi$_{3-p}$(Al, Si)$_{1+p}$O$_{4-2p}$N$_{2p}$, BaLi$_{3-p}$(Al, Si)$_{1+p}$O$_{4-2p}$N$_{2p}$, SrLi$_{3-p}$(Al, Si)$_{1+p}$O$_{4-2p}$N$_{2p}$, SrLi$_{3-p}$(Ga, Si)$_{1+p}$O$_{4-2p}$N$_{2p}$, MgLi$_{3-p}$(Ga, Si)$_{1+p}$O$_{4-2p}$N$_{2p}$, CaLi$_{3-p}$(Ga, Si)$_{1+p}$O$_{4-2p}$N$_{2p}$, BaLi$_{3-p}$(Ga, Si)$_{1+p}$O$_{4-2p}$N$_{2p}$, or ZnLi$_{3-p}$(Ga, Si)$_{1+p}$O$_{4-2p}$N$_{2p}$ (where 0≤p<2.0 and preferably 0≤p<1.95). When the emission intensity of the phosphor changes or the tone thereof is controlled, the phosphor host crystal can be appropriately selected from the phosphor host crystals represented by the compositional formulae.

In order to obtain a phosphor having a higher emission intensity, it is preferable that a phosphor host crystal represented by M$_\alpha$(L, A)$_\beta$X$_\gamma$ is stably produced. When this phosphor is obtained, examples of candidates of the phosphor host crystal include phosphor host crystals represented by compositional formulae SrLi$_{3-p}$Al$_{1+p}$O$_{4-2p}$N$_{2p}$, MgLi$_{3-p}$Al$_{1+p}$O$_{4-2p}$N$_{2p}$, CaLi$_{3-p}$Al$_{1+p}$O$_{4-2p}$N$_{2p}$, BaLi$_{3-p}$Al$_{1+p}$O$_{4-2p}$N$_{2p}$, (Ca, Mg)Li$_{3-p}$Al$_{1+p}$O$_{4-2p}$N$_{2p}$, (Sr, Ca)Li$_{3-p}$Al$_{1+p}$O$_{4-2p}$N$_{2p}$, (Sr, Ba)Li$_{3-p}$Al$_{1+p}$O$_{4-2p}$N$_{2p}$, SrLi$_{3-p}$Ga$_{1+p}$O$_{4-2p}$N$_{2p}$, MgLi$_{3-p}$Ga$_{1+p}$O$_{4-2p}$N$_{2p}$, CaLi$_{3-p}$Ga$_{1+p}$O$_{4-2p}$N$_{2p}$, and BaLi$_{3-p}$Ga$_{1+p}$O$_{4-2p}$N$_{2p}$ (where 0≤p<2.0 and preferably 0≤p<1.95).

In addition, in the phosphor according to the embodiment, the phosphor host crystal belongs to a triclinic system, and may be a crystal having the space group P-1 symmetry.

In addition, in the phosphor according to the embodiment, it is preferable that the lattice constants a, b, and c of the phosphor host crystal are values in the following ranges of
a=0.5754±0.05 nm,
b=0.7344±0.05 nm, and
c=0.9743±0.05 nm.

Further, it is preferable that the phosphor according to the embodiment is represented by a compositional formula

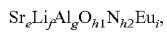

compositional proportions e, f, g, h1, h2, and i satisfy $e+f+g+h1+h2+i=9$, $0.00<e<1.30$, $0.70 \leq f \leq 3.30$, $0.70 \leq g \leq 3.30$, $3.70 \leq h1+h2 \leq 4.30$ (where $h1>0$), $0.00<i<1.30$, and $0.70 \leq e+i \leq 1.30$.

It is considered that, by adopting the compositional proportions, the phosphor host crystal is stably produced, and a phosphor having a higher emission intensity can be obtained.

The compositional proportion e is a parameter representing the compositional proportion of Sr, and when the compositional proportion e is less than 1.30, the crystal structure is stable, and a decrease in emission intensity can be suppressed. The compositional proportion f is a parameter representing the compositional proportion of Li, and when the compositional proportion e is 0.70 or more and 3.30 or less, the crystal structure is stable, and a decrease in emission intensity can be suppressed. The compositional proportion g is a parameter representing the compositional proportion of Al, and when the compositional proportion e is 0.70 or more and 3.30 or less, the crystal structure is stable, and a decrease in emission intensity can be suppressed. The compositional proportions h1 and h2 are parameters representing the compositional proportions of O and N, and when the compositional proportions h1 and h2 are 3.70 or more and 4.30 or less (where h1>0), the crystal structure of the phosphor is stable, and a decrease in emission intensity can be suppressed. The compositional proportion i is a parameter representing the compositional proportion of Eu, and when i is more than 0.00, a decrease in brightness caused by an insufficient amount of the activation element can be suppressed. When i is less than 1.30, the structure of the phosphor host crystal can be sufficiently maintained. When i is 1.30 or more, the structure of the phosphor host crystal may be unstable. In addition, when i is less than 1.30, a decrease in emission intensity caused by a concentration quenching phenomenon that occurs due to an interaction between activation elements can be suppressed, which is preferable.

Further, it is presumed that, in the phosphor in which the compositional proportions f and g satisfy $7/40 \leq g/(f+g) < 30/40$, the crystal structure is stable and the emission intensity is particularly high, which is preferable.

In addition, it is presumed that, in a phosphor in which the compositional proportions h1 and h2 satisfy $0<h1/(h1+h2) \leq 1$, the crystal structure is more stable and the emission intensity is high, which is preferable.

In addition, in the phosphor according to the embodiment, for example, by irradiation with light having a light intensity peak in a wavelength range of 250 nm or longer and 500 nm or shorter, fluorescence having a light intensity peak in a wavelength range of 430 nm or longer and 670 nm or shorter can be emitted.

More preferably, by irradiation with light having a light intensity peak in the wavelength range of 250 nm or longer and 500 nm or shorter, fluorescence having a light intensity peak in a wavelength range of 560 nm or longer and 580 nm or shorter can be emitted.

The phosphor according to the embodiment is a phosphor in which the phosphor host crystal is substituted with Eu as an activation element. The phosphor including Eu as the activation element is a phosphor having a high emission intensity, and with the specific composition, a phosphor that emits fluorescence in a blue to red range that is a wavelength range of 430 nm or longer and 670 nm or shorter can be obtained.

It is more preferable that the phosphor according to the embodiment is represented by a compositional formula $Sr_{1-r}Li_{3-q}Al_{1+q}O_{4-2q}N_{2q}Eu_r$, in which
parameters q and r satisfy $0<i<2.0$, and $0<r<1.0$.

In the phosphor represented by the compositional formula, by appropriately changing the values of the parameters q and r to change a Eu/Sr ratio, a Li/Al ratio, and a N/O ratio while maintaining the stable crystal structure, the excitation peak wavelength or the emission peak wavelength of the phosphor can be continuously changed.

By changing the emission peak wavelength of the phosphor, the color of light emitted when excitation light is irradiated can be adjusted to be, for example, in a range of $0 \leq x \leq 0.8$ and $0 \leq y \leq 0.9$ in terms of the values of the CIE 1931 chromaticity coordinates. This phosphor can emit light in a blue to red range and is preferably used as, for example, a phosphor for a white LED.

The phosphor according to the embodiment is a phosphor that absorbs energy of vacuum ultraviolet light, ultraviolet light, visible light, or radiation having a wavelength of 100 nm or longer and 500 nm or shorter as an excitation source and emits excitation light. Examples of the radiation include X-rays, gamma rays, α rays, β rays, electron rays, and neutron rays, and the present invention is not particularly limited. By using these excitation sources, the phosphor according to the embodiment can efficiently emit light.

In addition, in order to control the emission peak wavelength to be in a wavelength range from 550 nm to 650 nm, preferably 550 nm to 630 nm, and more preferably 550 nm to 590 nm when the excitation light has a wavelength of 380 nm to 450 nm, it is preferable that the parameters q and r satisfy $q=0$ and $0<r<0.05$.

It is preferable that the phosphor according to the embodiment is formed of particles of single crystal of the phosphor according to the embodiment, aggregated particles of single crystal of the phosphor according to the embodiment, or a mixture thereof. It is desirable that the phosphor according to the embodiment has as high purity as possible. A material other than the phosphor according to the embodiment, for example, impurities other than the phosphor according to the embodiment may be inevitably included as long as the emission of the phosphor does not deteriorate.

For example, impurity elements Fe, Co, and Ni in the raw material or a firing container may decrease the emission intensity of the phosphor. In this case, by adjusting the total concentration of the impurity elements in the phosphor to be 500 ppm or less, the influence of a decrease in emission intensity can be reduced.

In addition, when the phosphor according to the embodiment is produced, a compound having a crystal phase other than that of the phosphor according to the embodiment or an amorphous phase (also referred to as "sub-phase") can be produced at the same time. The sub-phase does not need to have the same composition as that of the phosphor according to the embodiment. It is preferable that the phosphor according to the embodiment does not include the sub-phase as far as possible. However, the phosphor may include the sub-phase within a range where the emission of the phosphor does not deteriorate.

That is, in one embodiment of the present invention, the phosphor according to the embodiment is a mixture of a compound in which a phosphor host crystal as the crystal represented by $M_\alpha(L, A)_\beta X_\gamma$ is substituted with Eu as the activation element in the ionic state and another crystal phase such as the sub-phase different from the crystal phase of the compound, in which the content of the compound is 20 mass % or more.

When desired characteristics cannot be obtained with the phosphor consisting of only the crystal represented by $M_\alpha(L, A)_\beta X_\gamma$, the above-described embodiment may be used. The content of the phosphor host crystal represented by $M_\alpha(L, A)_\beta X_\gamma$ may be adjusted depending on the desired characteristics, and when the content of the phosphor host crystal is 20 mass % or more, the emission intensity is sufficient. From this viewpoint, it is preferable that the phosphor according to the embodiment includes 20 mass % or more of the main component of the above-described compound. When the excitation source is irradiated, the phosphor can emit fluorescence having a peak in a wavelength range from 400 nm to 670 nm.

In addition, the form of the phosphor according to the embodiment is not particularly limited and, when used as dispersed particles, is preferably, for example, single crystal particles having an average particle size of 0.1 μm or more and 50 μm or less or aggregated particles of the single crystal. When the particle size is controlled to be in the above-described range, the emission efficiency is high, and the operability when the phosphor is mounted on a LED is high. The average particle size is a volume median size (d50) defined by JIS Z 8825 (2013) that is calculated from a particle size distribution (cumulative distribution) measured using a particle size distribution analyzer in which a laser diffraction scattering method is the measurement principle. In addition, the phosphor according to the embodiment can be sintered again to be used in an non-particle form. In particular, a plate-shaped sintered compact including the phosphor is generally called a phosphor plate and can be preferably used, for example, as a light-emitting member of a light-emitting element.

<2. Method of Producing Phosphor>

A method of producing the phosphor according to the embodiment will be described.

An example of the method of producing the phosphor is a method of producing a phosphor having a composition including at least one element M selected from the group consisting of Mg, Ca, Sr, Ba, and Zn, at least one element L selected from the group consisting of Li, Na, and K, at least one element A selected from the group consisting of Al, Ga, B, In, Sc, Y, La, and Si, at least one element X (except that X represents only N) selected from the group consisting of O, N, F, and Cl, and Eu, the method including: a mixing step of obtaining a raw material mixture including respective elements forming the composition; and a firing step of firing the raw material mixture such that at least some of $Eu^{3+}$ in the raw material mixture is reduced into $Eu^{2+}$.

In the method of producing the phosphor, by irradiation with light having a wavelength of 260 nm, when a fluorescence intensity at a wavelength of 569 nm is represented by $I_0$ and a fluorescence intensity at a wavelength of 617 nm is represented by $I_1$, a fluorescence intensity ratio $I_1/I_0$ is 0.01 or more and 0.4 or less.

In an example of the mixing step, the raw material mixture may be obtained by mixing a raw material including the element M, a raw material including the element L, a raw material including the element A, a raw material including the element X (except that X represents only N), and a raw material including Eu with each other.

When the raw materials are compounds, one compound may include a plurality of elements among M, L, A, X, and Eu, or the raw material may be a single substance, that is, is formed of a single element. For example, when the element X is included in any one of the raw material including the element M, the raw material including the element L, the raw material including the element A, and the raw material including Eu, the raw material including the element X does not need to be used.

The raw material including the element M is a single substance or a mixture of two or more kinds selected from a metal, an oxide, a carbonate, a hydroxide, an oxynitride, a nitride, a hydride, a fluoride, a chloride that include one or more elements selected from Mg, Ca, Sr, Ba, and Zn. Specifically, an oxide is preferably used.

The raw material including the element L is a single substance or a mixture of two or more kinds selected from a metal, an oxide, a carbonate, a hydroxide, an oxynitride, a nitride, a hydride, a fluoride, a chloride that include one or more elements selected from Li, Na, and K. Specifically, an oxide is preferably used.

The raw material including the element A is a single substance or a mixture of two or more kinds selected from a metal, an oxide, a carbonate, a hydroxide, an oxynitride, a nitride, a hydride, a fluoride, a chloride that include one or more elements selected from Al, Ga, B, In, Sc, Y, La, and Si. Specifically, an oxide is preferably used.

The raw material including Eu is a single substance or a mixture of two or more kinds selected from an alloy, an oxide, a nitride, a fluoride, and a chloride that include Eu. Specifically, europium oxide is preferably used. It is preferable that each of the raw materials is powdery.

The raw material including the element X is a single substance or a mixture of two or more kinds selected from an oxide, a nitride, a fluoride, and a chloride. The oxide, the nitride, the fluoride, and the chloride may include M, L, A, or Eu. In this case, the nitride may be a part of the raw material, not the entirety thereof.

For example, when a $SrLi_3AlO_4$ phosphor activated with Eu is produced, it is preferable that a raw material mixture is used using compounds including an oxide, a nitride, or a fluoride of europium, an oxide, a nitride, or a fluoride of strontium, an oxide, a nitride, or a fluoride of lithium, and an oxide, a nitride, or a fluoride of aluminum. In addition, for example, a composite metal, an oxide, a carbonate, a hydroxide, an oxynitride, a nitride, a hydride, a fluoride, or a chloride that include strontium and lithium, strontium and aluminum, aluminum and lithium, or strontium, lithium, and aluminum may be used as a starting material. In particular, it is more preferable to use europium oxide, strontium oxide, lithium oxide, and lithium aluminum oxide.

In the method of producing the phosphor according to the embodiment, during the firing for the synthesis of the phosphor according to the embodiment, a compound including an element other than the elements forming the phosphor may be added for firing, the compound producing a liquid phase at a temperature of a firing temperature or lower. The compound that produces a liquid phase functions as a flux to promote the synthesis reaction of the phosphor and the particle growth. Therefore, the stable crystal can be obtained, and the emission intensity of the phosphor can be improved.

Examples of the compound that produces a liquid phase at the temperature of the firing temperature or lower include one kind or a mixture of two or more kinds selected from a fluoride, a chloride, an iodide, a bromide, and a phosphate including one or more elements selected from Mg, Ca, Sr, Ba, Zn, Li, Na, K, Al, Ga, B, In, Sc, Y, La, and Si. These compounds have different melting points and thus may be appropriately used depending on the synthesis temperature. The compound that produces a liquid phase includes raw materials in the embodiment for convenience sake.

In order to produce the phosphor in the form of a powder or an aggregate, it is preferable that each of the raw materials is a powder. In addition, the synthesis reaction of the phosphor may initiate from a contact portion between the raw material powders. When the average particle size of the raw material powder is 500 μm or less, the area of the contact portion between the raw material powders increases such that the reactivity is improved, which is preferable.

(Mixing Method)

In the method of producing the phosphor according to the embodiment, a method of mixing the respective raw materials to obtain the raw material mixture is not particularly limited, and a well-known mixing method is used. That is, not only a method of mixing the raw materials through a dry process but also a method of mixing the raw materials through a wet process in an inert solvent that is not substantially reactive with the raw materials and subsequently removing the solvent can be used for mixing. As a mixing device, for example, a V-type mixer, a rocking mixer, a ball mill, or a vibrating mill is preferably used.

(Firing Container)

During the firing of the raw material mixture, various heat-resistant materials can be used as the firing container containing the raw material mixture. For example, a container formed of boron nitride such as a boron nitride sintered compact, a container formed of alumina such as an alumina sintered compact, a carbon container such as a carbon sintered compact, or a container formed of a metal such as molybdenum, tungsten, or tantalum can be used.

(Firing Temperature)

In the method of producing the phosphor according to the embodiment, the firing temperature of the raw material mixture can be appropriately set and may be, for example, 780° C. or higher and 1500° C. or lower. By adjusting the firing temperature to be 780° C. or higher, the crystal growth of the phosphor is likely to progress, and sufficient fluorescence characteristics can be obtained. In addition, by adjusting the firing temperature to be 1500° C. or lower, the decomposition of the phosphor can be suppressed, and deterioration in fluorescence characteristics can be suppressed. The firing time varies depending on the firing temperature and is typically about 1 to 10 hours. An aging pattern of heating, temperature holding, and cooling in the firing is not particularly limited, and a raw material may be optionally added in the process of firing.

(Firing Atmosphere)

The firing step is performed in a reducing firing atmosphere where at least some of $Eu^{3+}$ in the raw material mixture can be reduced into the state of $Eu^{2+}$. The firing atmosphere may include, for example, neutral gas such as $N_2$ and may include reducing gas such as $NH_3$, $H_2$ or $CH_4$. These gases may be used alone or may be used in combination of two or more kinds. Among these, from the viewpoint of the emission intensity, $NH_3$, $N_2$, or $H_2$ may be used, and $NH_3$ or $N_2$ may be preferably used.

The gas in the firing atmosphere may be configured such that, for example, $NH_3$ or $N_2$ is the main component. The purity of $NH_3$ or $N_2$ at 200° C. is, for example, 98 vol % or more and preferably 99 vol % or more.

In addition, as a furnace material such as a heat insulating material or a heater, a graphite resistance heating type electric furnace formed of carbon, an all metal furnace formed of molybdenum or tungsten, a tube furnace where a furnace tube formed of alumina or quartz is heated with a heater, or a furnace to which corrosion resistance is imparted may be used. Depending on the furnace material, gas species may be used.

(Firing Pressure)

The pressure range during firing is as high as possible in order to suppress the thermal decomposition of the raw material mixture and the phosphor that is a product of the raw material mixture. Specifically, the pressure range is 0.1 MPa (atmospheric pressure) or higher.

(Number of Times of Firing)

The number of times of the firing step may be one or plural.

The number of times of the firing step refers to the number of repetitions of the step until the firing temperature and the firing pressure of the raw material mixture are controlled, the firing temperature is held, the control of the firing pressure is released, and the raw material mixture is cooled to room temperature.

In the embodiment, for example, by appropriately selecting the kind and blending amount of each of the elements in the phosphor, the method of producing the phosphor, and the like, the fluorescence intensity ratios $I_1/I_0$ and $I_2/I_0$ can be controlled. In particular, for example, the execution of the firing step in the reducing firing atmosphere, the appropriate selection of the gas species in the firing atmosphere, the firing temperature, and the number of times of the firing step, and the like are elements for adjusting the fluorescence intensity ratio $I_1/I_0$ and $I_2/I_0$ to be in the desired numerical ranges.

(Annealing Process after Firing)

The phosphor obtained by firing, the phosphor powder obtained by crushing the phosphor, and the phosphor powder obtained after adjusting the particle size can also be heated (also referred to as "annealing process") at a temperature of 600° C. or higher and 1300° C. or lower. Through the operation, defects in the phosphor and damages caused by crushing can be recovered. The defects and the damages may cause a decrease in emission intensity, and the emission intensity can be recovered by the heat treatment.

Further, the phosphor after firing or after the annealing process can also be cleaned with a solvent or an acidic or basic solution. Through this operation, the content of the compound that produces a liquid phase at the temperature of the firing temperature or lower and the sub-phase can be reduced. As a result, the emission intensity of the phosphor can increase.

In the phosphor according to the embodiment, a wide excitation range of radiation and ultraviolet light to visible light can be obtained, light in a blue to red range can be emitted, the colors of blue to red in a wavelength range 450 nm or longer 650 nm or shorter can be exhibited with the specific composition, and the emission wavelength or the emission peak width can be adjusted. Due to the emission characteristics, the phosphor according to the embodiment is useful as a material forming a light-emitting element that includes the phosphor according to the embodiment or a phosphor plate including the phosphor according to the embodiment. Further, a lighting apparatus or an image display apparatus including the light-emitting element or the phosphor according to the embodiment is also suitable for a pigment or an ultraviolet absorber. Instead of using the phosphor according to the embodiment alone, for example, a composition obtained by mixing various materials including the phosphor according to the embodiment with a resin or the like, and a compact such as a phosphor molded article, a phosphor sheet, or a phosphor film obtained by molding the composition can be provided. The phosphor according to the embodiment does not deteriorate even after exposure to a high temperature, is advantageous in that heat resistance is excellent and long-term stability in an oxidizing atmosphere and a water environment is excellent, and can provide a product having excellent durability.

<3. Light-Emitting Element>

The phosphor according to the embodiment can be used for various applications. The light-emitting element including the phosphor according to the embodiment is one aspect of the present invention. The form of the phosphor according to the embodiment in the light-emitting element may be particulate or may be a form in which the particulate phosphor is sintered again. The form in which the particulate phosphor is sintered again into a flat shape will also be referred to as "phosphor plate". In addition, generally, the light-emitting element described herein is configured to include a phosphor and an excitation source of the phosphor.

When a light-emitting element that is generally called a light-emitting diode (also referred to as LED) is formed using the phosphor according to the embodiment, for example, in general, a configuration in which a phosphor-containing composition in which the phosphor according to the embodiment is dispersed is arranged in a resin or a glass (also collectively referred to as "solid medium") such that the phosphor is irradiated with excitation light emitted from the excitation source is preferably adopted. At this time, the phosphor-containing composition can also include a phosphor other than the phosphor according to the embodiment.

As the resin that can be used as a solid medium of the phosphor-containing composition, any resin can be selected depending on the purpose and the like as long as it is liquid before molding or during the dispersion of the phosphor and does not cause a reaction that is not preferable for the phosphor or the light-emitting element according to the embodiment to occur. Examples of the resin include an addition reaction type silicone resin, a condensation reaction type silicone resin, a modified silicone resin, an epoxy resin, a polyvinyl resin, a polyethylene resin, a polypropylene resin, and a polyester resin. Among these resins, one kind may be used alone, or two or more kinds may be used in combination at a given combination and ratio. When the resin is a thermosetting resin, the phosphor-containing composition in which the phosphor according to the embodiment is dispersed can be obtained by curing the thermosetting resin.

The ratio of the solid medium used is not particularly limited and may be appropriately adjusted depending on the intended use and the like. In general, the mass ratio of the solid medium to the phosphor according to the embodiment is typically 3 mass % or more and preferably 5 mass % or more and is typically 30 mass % or less and preferably 15 mass % or less.

In addition, in addition to the phosphor according to the present invention and the solid medium, the phosphor-containing composition according to the embodiment may include other components depending on the use and the like. Examples of the other components include a diffusing agent, a thickener, an extender, and an interfering agent. Specifically, for example, silica fine powder such as Aerosil or alumina can be used.

In addition, as the phosphor other than the phosphor according to the embodiment, one phosphor or two or more phosphors selected from BAM phosphor, $\beta$-sialon phosphor, $\alpha$-sialon phosphor, $Sr_2Si_5N_8$ phosphor, $(Sr, Ba)_2Si_5N_8$ phosphor, $CaAlSiN_3$ phosphor, $(Ca, Sr)AlSiN_3$ phosphor, KSF phosphor, YAG phosphor, and $(Ca, Sr, Ba)Si_2O_2N_2$ may be included.

In addition to the phosphor according to the embodiment, one embodiment of the light-emitting element can further include a blue phosphor that emits light having a peak wavelength of 420 nm or longer and 500 nm or shorter from an emitter or a light-emitting source. Examples of the blue phosphor include $AlN:(Eu, Si)$, $BAM:Eu$, $SrSi_9Al_{19}ON_{31}:Eu$, $LaSi_9Al_{19}N_{32}:Eu$, $\alpha$-sialon:Ce, and JEM:Ce.

In addition to the phosphor according to the embodiment, one embodiment of the light-emitting device can further include a green phosphor that emits light having a peak wavelength of 500 nm or longer and 550 nm or shorter from an emitter or a light-emitting source. Examples of the green phosphor include $\beta$-sialon:Eu, $(Ba, Sr, Ca, Mg)_2SiO_4:Eu$, and $(Ca, Sr, Ba)Si_2O_2N_2:Eu$.

In addition to the phosphor according to the embodiment, one embodiment of the light-emitting device can further include a yellow phosphor that emits light having a peak wavelength of 550 nm or longer and 600 nm or shorter from an emitter or a light-emitting source. Examples of the yellow phosphor include YAG:Ce, $\alpha$-sialon:Eu, $CaAlSiN_3:Ce$, and $La_3Si_6N11:Ce$.

In addition to the phosphor according to the embodiment, one embodiment of the light-emitting device can further include a red phosphor that emits light having a peak wavelength of 600 nm or longer and 700 nm or shorter from an emitter or a light-emitting source. Examples of the red phosphor include $CaAlSiN_3:Eu$, $(Ca, Sr)AlSiN_3:Eu$, $Ca_2Si_5N_8:Eu$, $Sr_2Si_5N_8:Eu$, and KSF:Mn.

When the light-emitting element according to the embodiment includes the phosphor according to the embodiment in the form of a phosphor plate, the phosphor plate is obtained by molding the particulate phosphor according to the embodiment in a desired shape and heating and sintering the molded article. In this case, the phosphor plate according to the embodiment may include a phosphor other than the phosphor according to the embodiment and other components. Examples of the other components include a glass as a medium, a binder resin, a dispersant, and a sintering additive. The additives of the binder resin, the dispersant, and the sintering additive are not particularly limited, and materials that are generally well-known in the field where they are decomposed and removed at the same time during heating and sintering can be preferably used.

The average particle size of the phosphor particles used for manufacturing the phosphor plate is not particularly limited, and the addition amount of the binder resin for imparting the moldability increases or decreases according to the specific surface area of particles of the phosphor material. Therefore, a binder resin having an average particle size of 0.1 µm or more and 30 µm or less can be preferably used.

The phosphor plate can be manufactured using a well-known method. For example, by adding the additives such as the binder resin, the dispersant, or the sintering additive to the powdery phosphor according to the embodiment, adding a dispersion medium thereto, mixing the components through a wet process, adjusting the viscosity of the obtained slurry to form the slurry in a shape such as a sheet shape or a disk shape, and heating and firing the additives to decompose and remove the additives, the phosphor sheet according to the embodiment can be obtained. The temperature and time of heating and firing and the firing atmosphere may be appropriately adjusted under well-known conditions depending on material to be used. In addition, a method of adding glass powder having a lower melting point than the phosphor according to the embodiment, molding the additives, and firing the molded article to manufacture the phosphor plate is effective.

The excitation source in the light-emitting element according to the embodiment is, for example, a light source that excites the phosphor according to the embodiment or another phosphor to emit light having excitation energy. The phosphor according to the embodiment is irradiated with vacuum ultraviolet light of 100 to 190 nm, ultraviolet light of 190 to 380 nm, an electron ray, or the like to emit light, and preferable examples of the excitation source include a blue semiconductor light-emitting element. The phosphor according to the embodiment also emits light using the light emitted from the excitation source and functions as a light-emitting element. The light-emitting element according to the embodiment does not need to be a single element and may be an integrated element in which a plurality of light-emitting elements are combined.

One embodiment of the light-emitting element according to the embodiment is a light-emitting element in which an emitter or a light-emitting source emits ultraviolet or visible light having a peak wavelength of 300 to 500 nm and preferably 300 to 470 nm and blue light to yellow green light to red light (for example, 435 nm to 570 nm to 750 nm) emitted from the phosphor according to the embodiment and light having a wavelength of 450 nm or longer emitted from another phosphor according to the embodiment are combined to emit white light or light other than white light.

The embodiment of the light-emitting element is exemplary, and it is needless to say that the phosphor according to the embodiment is appropriately combined with the blue phosphor, the green phosphor, the yellow phosphor, or the red phosphor such that white light having a desired color can be achieved.

In addition, in one embodiment of the light-emitting element, when a LED in which an emitter or a light-emitting source emits light having a wavelength of 280 to 500 nm is used, the emission efficiency is high. Therefore, a high-efficiency light-emitting device can be configured. Light emitted from the excitation source to be used is not particularly limited to monochromatic light and may be multichromatic light.

Figure 3:
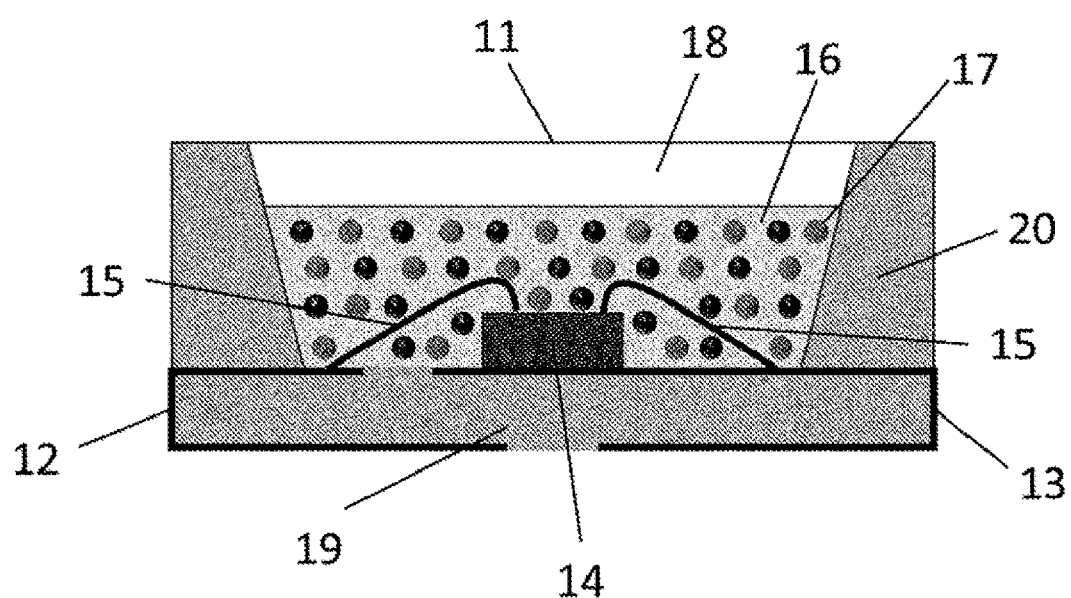
FIG. 3 is a schematic diagram showing a surface-mounted LED element including a phosphor according to an embodiment of the present invention.

FIG. 3 shows the summary of a light-emitting element (surface-mounted LED) including the phosphor according to the embodiment.

A surface-mounted white light-emitting diode lamp (11) is prepared. Two lead wires (12, 13) are fixed to a white alumina ceramic substrate (19) having a high visible light reflectivity, one end of the wire is positioned substantially at the center of the substrate, and another end of the wire is exposed to the outside and is soldered to form an electrode during mounting on an electric substrate. A blue light-emitting diode element (14) having an emission peak wavelength of 450 nm is placed to be positioned at the center of the substrate and fixed to one end of one of the lead wires (12). A lower electrode of the blue light-emitting diode element (14) is electrically connected to the lower lead wire through a conductivity paste, and an upper electrode of the blue light-emitting diode element (14) is electrically connected to the other lead wire (13) through a bonding wire (15) formed of a metal wire.

A phosphor (17) in which a first resin (16) and the phosphor according to the embodiment are mixed is mounted in the vicinity of the light-emitting diode element. The first resin in which the phosphor is dispersed is transparent and covers the entirety of the blue light-emitting diode element (14). In addition, a wall surface member (20) having a shape where a hole is formed in the center portion is fixed to the ceramic substrate. In the wall surface member (20), the hole for housing the resin (16) where the blue light-emitting diode element (14) and the phosphor (17) are dispersed is formed in the center portion, and a portion facing the center forms an inclined surface. This inclined surface is a reflective surface for extracting light to the front, and a curved shape of the inclined surface is determined in consideration of a light reflection direction. In addition, at least a surface forming the reflective surface is a surface having a high visible light reflectivity that is white or has metallic gloss. In the light-emitting element, the wall surface member (20) is formed of a white silicone resin. The hole in the center portion of the wall surface member forms a recess portion as a final shape of a chip type light-emitting diode lamp. Here, the hole is filled with a transparent second resin (18) such that the entirety of the first resin (16) in which the blue light-emitting diode element (14) and the phosphor (17) are dispersed is sealed. In the light-emitting element, the same epoxy resin can be used as the first resin (16) and the second resin (18). The light-emitting element emits white light.

<4. Light-Emitting Device>

Further, a light-emitting device including the light-emitting element according to the aspect is one aspect of the present invention. Specific examples of the light-emitting device include a lighting apparatus, a backlight for a liquid crystal panel, and various display apparatuses.

<5. Image Display Apparatus>

Further, an image display apparatus including the light-emitting element according to the aspect is one aspect of the present invention. Specific examples of the image display apparatus include a vacuum-fluorescent display (VFD), a field emission display (FED), a plasma display panel (PDP), a cathode-ray tube (CRT), and a liquid crystal display (LCD).

<6. Pigment>

The phosphor according to the embodiment can also be used, for example, as a material for forming a pigment using the function of the phosphor. That is, when the phosphor according to the embodiment is irradiated with sunlight or light emitted from a lighting apparatus such as a fluorescent lamp, a white object color is observed. Since this color is good and does not deteriorate for a long period of time, the phosphor according to the embodiment can be suitable for, for example, an inorganic pigment. Therefore, when the phosphor according to the embodiment is used as a pigment to be added to a coating material, an ink, a paint, a glaze, or a plastic product, satisfactory white color can be maintained for a long period of time.

<7. Ultraviolet Absorber>

Instead of being used alone, the phosphor according to the embodiment can also be used, for example, as a material for forming an ultraviolet absorber using the function of the phosphor. That is, when the ultraviolet absorber including the phosphor according to the embodiment is kneaded into a plastic product or a coating material or is applied to a surface of a plastic product, the plastic product or the coating material can be effectively protected from deteriorating due to ultraviolet light.

<8. Phosphor Sheet>

The phosphor according to the embodiment is mixed with, for example, a resin to form a composition, and a phosphor molded article, a phosphor film, and a phosphor sheet obtained by molding the composition are preferable use examples of the phosphor according to the embodiment. For example, the phosphor sheet according to the embodiment is a sheet in which the phosphor according to the embodiment is included to be uniformly dispersed in a medium. A material of the medium is not particularly limited, is preferably transparent, and is a material where the form of a sheet shape can be maintained. For example, a resin can be used. Specific examples of the material include a silicone resin, an epoxy resin, a polyarylate resin, a PET-modified polyarylate resin, a polycarbonate resin, a cyclic olefin, a polyethylene terephthalate resin, a polymethyl methacrylate resin, a polypropylene resin, a modified acryl, a polystyrene resin, and an acrylonitrile-styrene copolymer resin. In the phosphor sheet according to the embodiment, a silicone resin or an epoxy resin is preferably used from the viewpoint of transparency. From the viewpoint of heat resistance, a silicone resin is preferably used.

Additives can be added to the phosphor sheet according to the embodiment. For example, a leveling agent to be optionally added during film formation, a dispersant for promoting the dispersion of the phosphor, or an adhesion auxiliary agent such as a silane coupling agent as an improver of a sheet surface may be added. In addition, inorganic particles such as silicone fine particles may be added as a phosphor sedimentation inhibitor.

The thickness of the phosphor sheet according to the embodiment is not particularly limited and may be determined depending on the phosphor content and desired optical characteristics. From the viewpoints of the phosphor content, workability, optical characteristics, and heat resistance, the thickness is, for example, preferably 10 μm or more and 3 mm or less and more preferably 50 μm or more and 1 mm or less.

A method of manufacturing the phosphor sheet according to the embodiment is not particularly limited, and a well-known method can be used. The phosphor sheet according to the embodiment may be a single-layer sheet or a multilayer sheet as long as it includes the phosphor according to the embodiment, and the entirety of the sheet does not need to be uniform. A substrate layer can also be provided on a single surface or both surfaces of the sheet or in the sheet. The material of the substrate layer is not particularly limited, and a well-known metal, film, glass, ceramic, paper, or the like can be used. Specific examples of the material of the substrate layer include a metal plate or foil such as aluminum (including an aluminum alloy), zinc, copper, or iron, a film of plastic such as cellulose acetate, polyethylene terephthalate (PET), polyethylene, polyester, polyamide, polyimide, polyphenylene sulfide, polystyrene, polypropylene, polycarbonate, polyvinyl acetal, or aramid, paper on which the plastic is laminated, paper coated with the plastic, paper on which the metal is laminated or deposited, and a plastic film on which the metal is laminated or deposited. In addition, when the substrate is a metal plate, the surface thereof may be plated with chrome or nickel or treated with a ceramic. In particular, it is preferable that the substrate is a flexible film having high strength. Therefore, for example, a resin film is preferable, and specific examples thereof include a PET film and a polyimide film.

Hereinafter, the embodiment of the present invention has been described. However, the embodiment is merely an example of the present invention, and various configurations other than the above-described configurations can also be adopted.

EXAMPLES

Hereinafter, the present invention will be described in more detail using Examples and Comparative Examples. However, the present invention is not limited to these Examples and Comparative Examples.
(Reference Example)

As a representative of the phosphor host crystal, $SrLi_3AlO_4$ that was a crystal having the same crystal structure as a phosphor host crystal represented by a crystal represented by $M_\alpha(L, A)_\beta X_\gamma$, or $SrLi_3AlO_4$ other than the crystal represented by $M_\alpha(L, A)_\beta X_\gamma$ was synthesized and was set as a reference example. Next, the crystal structure of $SrLi_3AlO_4$ of the obtained reference example was analyzed, and it was verified that $SrLi_3AlO_4$ is an unprecedented new material. This reference example was used for comparison to the crystal structure of a phosphor host crystal of each of phosphors synthesized in Examples 1 to 7.
<Raw Materials>

As raw materials of $SrLi_3AlO_4$ of the reference example, aluminum oxide (TAIMICRON, manufactured by Taimei Chemicals Co., Ltd.) powder, strontium oxide (SrO, manufactured by Kojundo Chemical Laboratory Co., Ltd.) powder, lithium oxide ($Li_2O$, manufactured by Kojundo Chemical Laboratory Co., Ltd.) powder, lithium aluminate ($LiAlO_2$, manufactured by Kojundo Chemical Laboratory Co., Ltd.) powder, and europium oxide ($Eu_2O_3$, purity: 99.9%, manufactured by Shin-Etsu Chemical Co., Ltd.) powder were used.

In a glove box filled with dry $N_2$ gas, the strontium oxide (SrO), the lithium oxide ($Li_2O$), and the lithium aluminate ($LiAlO_2$) were weighed at an atom ratio (Sr:Li:Al) between Sr, Li, and Al of 1:3:1 and were mixed with each other using a pestle and a mortar formed of a silicon nitride sintered compact for 10 minutes. Next, the obtained raw material mixed powder was filled into a crucible formed of alumina.

The crucible filled with the raw material mixed powder was set in a tube furnace. The procedure of firing the mixed powder was as follows. First, the firing atmosphere was temporarily pressurized to 10 Pa or lower using a rotary pump, $NH_3$ having a purity of 99.999 vol % was introduced into the furnace such that the internal pressure of the furnace was the atmospheric pressure, the $NH_3$ gas flow rate was controlled to 2 L/min, the temperature was increased from the room temperature to 800° C. at a rate of 7° C. per minute, and this temperature was held for 4 hours. Next, the introduction of the $NH_3$ gas was released, and the mixed powder was cooled to room temperature.

The fired raw material mixed powder (in the present specification, also referred to as "synthetic material") was taken out from the crucible, and was crushed using a pestle and a mortar formed of a silicon nitride sintered compact to obtain a powdery synthetic material. When elemental analysis was performed on the powdery synthetic material by ICP emission spectroscopy, it was verified that an atom ratio (analysis value) between Sr, Li, and Al was 1.0:3.0:1.0 and there was no change between the compositions before and after firing.

The powdery synthetic material was observed with an optical microscope, crystal particles having a particle size of 8 μm×6 μm×4 μm were collected and were fixed to tips of a glass fibers using an organic adhesive. For the crystal particles, using a single crystal X-ray diffractometer (SMART APEX II Ultra, manufactured by Bruker AXS Inc.) with a rotating anticathode for MOKα rays, X-ray diffraction measurement was performed under conditions of an X-ray source output of 50 kV and 50 mA. As a result, it was verified that the crystal particles are single crystal.

The crystal structure was obtained from the X-ray diffraction measurement result using a single crystal structure analysis software (APEX2, manufactured by Bruker AXS Inc.). The obtained crystal structure data were shown in Table 1. In addition, the crystal structure is shown in FIG. 1. Table 1 shows the crystal system, the space group, the lattice constants, the kinds of atoms, and the atom positions. Using this data, the shape of the unit lattice and the arrangement of atoms in the lattice can be determined.

This crystal belonged to the triclinic system and belonged to the P-1 space group (the second space group of International Tables for Crystallography), and the lattice constants a, b, and c and the angles α, β, and γ were as follows.

a=0.5754 nm
b=0.7344 nm
c=0.9743 nm
α=83.931 degrees
β=76.692 degrees
γ=79.657 degrees The atom positions were as shown in Table 1. Sr or O was present at independent atom positions, and Li and Al were present at the same atom position at a given ratio such that the atom ratio between Li and Al was 3:1 as the entire crystal.

It was verified from the crystal structure data shown in Table 1 that the $SrLi_3AlO_4$ crystal was a new material that was not yet reported. In addition, a powder X-ray diffraction pattern was calculated from the crystal structure data. FIG. 2 shows powder X-ray diffraction using a CuKα ray calculated from the crystal structure of the $SrLi_3AlO_4$ crystal. In the following description, when the powder X-ray diffraction measurement of the synthetic material was performed and the measured powder X-ray diffraction pattern was the same as that of FIG. 2, it was determined that the $SrLi_3AlO_4$ crystal was produced.

Further, when the crystal having the same crystal structure as that of the $SrLi_3AlO_4$ crystal other than the $SrLi_3AlO_4$ crystal was investigated with reference to the $MLi_3AlO_4$ crystal, it was found that, in the $SrLi_3AlO_4$ crystal, some or all of Sr can be substituted with Mg, Ca, Ba, and Zn while maintaining the crystal structure. That is, the crystal of $MLi_3AlO_4$ (M represents one or more elements selected from Mg, Ca, Ba, and Zn or a mixture thereof) has the same crystal structure as that of the $SrLi_3AlO_4$ crystal. Further, it was verified that some of Li can be substituted with Al, some or all of Al can be substituted with Ga and Si, and the $MLi_3AlO_4$ crystal is one composition of the crystal having the same crystal structure as that of $SrLi_3AlO_4$.

Further, when the crystal having the same crystal structure as that of the $SrLi_3AlO_4$ crystal other than the $SrLi_3AlO_4$ crystal was investigated with reference to the $MLi_3AlO_4$ crystal, it was verified that, in the $SrLi_3AlO_4$ crystal, some of O can be substituted with N by controlling the ratio between Li and Al in order to maintain the electrical neutrality in the entire crystal. It can be described that the crystal has a composition represented by $Sr_{1-r}Li_{3-q}Al_{1+q}O_{4-2q}N_{2q}Eu_r$ (in the compositional formula, $0 \leq q < 2.0$ and $0 < r < 1.0$).

Even regarding a crystal obtained by changing the lattice constants and the like while maintaining the crystal structure as the $SrLi_3AlO_4$ crystal, the powder X-ray diffraction pattern can be calculated from the values of the lattice constants obtained by the powder X-ray diffraction measurement and the crystal structure data in Table 1. Accordingly, by comparing the calculated powder X-ray diffraction pattern and the measured powder X-ray diffraction pattern to each other, whether or not the crystal is the $SrLi_3AlO_4$ crystal can be determined.

Example 1

According to a designed composition (atom ratio) in Example 1 shown in Table 2 below, the powdery raw materials were weighed in a glove box filled with dry $N_2$ gas such that a raw material mixed composition (mass ratio) shown in Table 3 was obtained.

The weighed raw material mixed powder was mixed using a pestle and a mortar formed of a silicon nitride sintered compact for 10 minutes. Next, the mixed powder was filled into a crucible formed of alumina.

TABLE 2

| Example | Sr | Eu | Li | Al | O |
|---|---|---|---|---|---|
| 1, 2, 3, 6 | 0.990 | 0.010 | 3.0 | 1.0 | 4.0 |
| 4 | 0.999 | 0.001 | 3.0 | 1.0 | 4.0 |
| 5 | 0.995 | 0.005 | 3.0 | 1.0 | 4.0 |

TABLE 3

| Example | SrO | $Li_2O$ | $LiAlO_2$ | $Eu_2O_3$ |
|---|---|---|---|---|
| 1, 2, 3, 6 | 51.25 | 14.93 | 32.94 | 0.88 |
| 4 | 51.89 | 14.98 | 33.04 | 0.09 |
| 5 | 51.61 | 14.96 | 33.00 | 0.44 |

The crucible filled with the raw material mixed powder was set in a tube furnace. The procedure of firing the mixed powder was as follows. First, the firing atmosphere was temporarily pressurized to 10 Pa or lower using a rotary pump, $NH_3$ having a purity of 99.999 vol % was introduced into the furnace such that the internal pressure of the furnace was the atmospheric pressure, the $NH_3$ gas flow rate was controlled to 2 L/min, the temperature was increased from the room temperature to 800° C. at a rate of 7° C. per minute, and this temperature was held for 4 hours. Next, the introduction of the $NH_3$ gas was released, and the mixed powder was cooled to room temperature.

The fired product was taken out from the crucible, was crushed using a pestle and a mortar formed of a silicon nitride sintered compact, and was filtered through a sieve having a pore size of 75 μm to obtain a powdery synthetic material (phosphor according to Example 1).

When the particle size distribution was measured using a laser diffraction method, the average particle size (d50) was 18 μm. When elemental analysis was performed on the powdery synthetic material by ICP emission spectroscopy, it was verified that an atom ratio (analysis value) between Sr, Li, and Al was 1.0:3.0:1.0 and there was no change between the compositions before and after firing.

Example 2

According to the designed composition shown in Table 2 and the raw material mixed composition shown in Table 3, a phosphor (powdery synthetic material) according to Example 2 was prepared using the same method as that of Example 1, except that the firing temperature was set to 825°

C. The average particle size of the synthetic material powder according to Example 2 was 18 μm. In addition, it was verified by ICP emission spectroscopy that an atomic ratio (analysis value) between Sr, Li, and Al was 1.0:3.0:1.0 and there was no change between the compositions before and after firing.

Example 3

According to the designed composition shown in Table 2 and the raw material mixed composition shown in Table 3, a phosphor (powdery synthetic material) according to Example 3 was prepared using the same method as that of Example 1, except that the firing time was set to 12 hours. The average particle size of the synthetic material powder according to Example 3 was 18 μm. In addition, it was verified by ICP emission spectroscopy that an atomic ratio (analysis value) between Sr, Li, and Al was 1.0:3.0:1.0 and there was no change between the compositions before and after firing.

Example 4

According to the designed composition shown in Table 2 and the raw material mixed composition shown in Table 3, a phosphor (powdery synthetic material) according to Example 4 was prepared using the same method as that of Example 1, except that the firing time was set to 8 hours, the firing process was performed three times, and the Eu concentration was changed in the designed composition and the raw material mixed composition. The average particle size of the synthetic material powder according to Example 4 was 18 μm. In addition, it was verified by ICP emission spectroscopy that an atomic ratio (analysis value) between Sr, Li, and Al was 1.0:3.0:1.0 and there was no change between the compositions before and after firing.

Example 5

According to the designed composition shown in Table 2 and the raw material mixed composition shown in Table 3, a phosphor (powdery synthetic material) according to Example 5 was prepared using the same method as that of Example 1, except that the firing time was set to 8 hours, the firing process was performed three times, and the Eu concentration was changed in the designed composition and the raw material mixed composition. The average particle size of the synthetic material powder according to Example 5 was 18 μm. In addition, it was verified by ICP emission spectroscopy that anatomic ratio (analysis value) between Sr, Li, and Al was 1.0:3.0:1.0 and there was no change between the compositions before and after firing.

Example 6

According to the designed composition shown in Table 2 and the raw material mixed composition shown in Table 3, a phosphor (powdery synthetic material) according to Example 6 was prepared using the same method as that of Example 1, except that the firing time was set to 8 hours and the firing process was performed three times. The average particle size of the synthetic material powder according to Example 6 was 18 μm. In addition, it was verified by ICP emission spectroscopy that an atomic ratio (analysis value) between Sr, Li, and Al was 1.0:3.0:1.0 and there was no change between the compositions before and after firing.

Comparative Example 1

According to the designed composition shown in Table 2 and the raw material mixed composition shown in Table 3, a phosphor (powdery synthetic material) according to Comparative Example 1 was prepared using the same method as that of Example 1, except that the firing step was performed in an Ar atmosphere instead of the $NH_3$ atmosphere. The average particle size of the synthetic material powder according to Comparative Example 1 was 18 μm. In addition, it was verified by ICP emission spectroscopy that an atomic ratio (analysis value) between Sr, Li, and Al was 1.0:3.0:1.0 and there was no change between the compositions before and after firing.

(X-Ray Diffraction)

Figure 4:
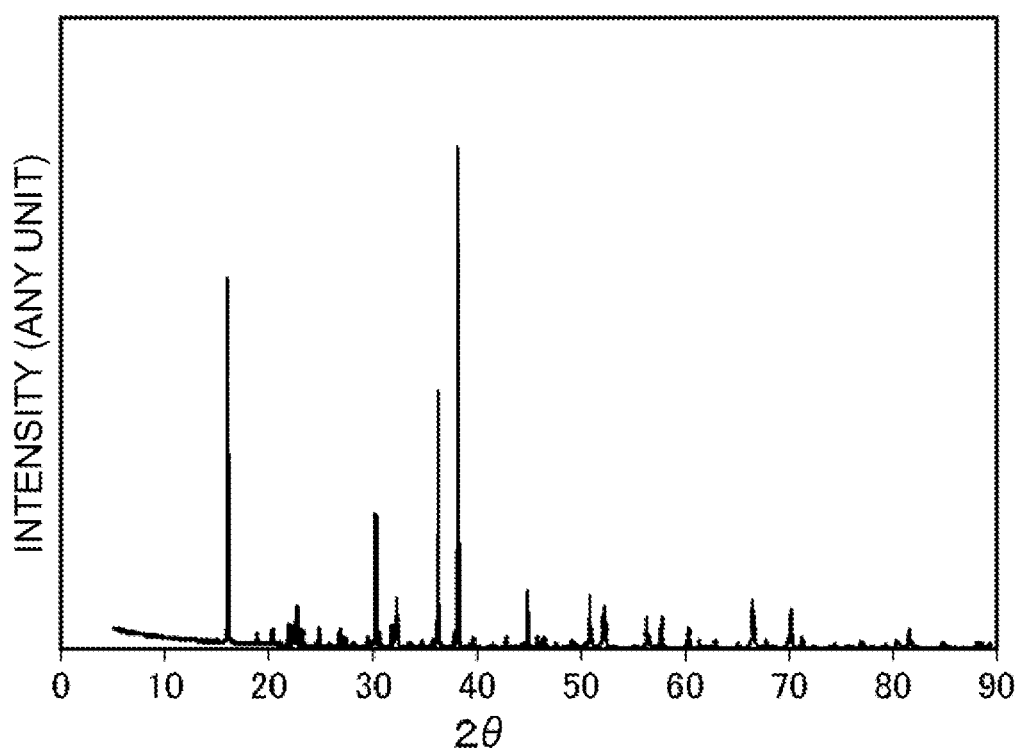
FIG. 4 is a diagram showing a powder X-ray diffraction result of a synthetic material synthesized in Example 1.

Powder X-ray diffraction measurement using a CuKα ray was performed. FIG. 4 shows the X-ray diffraction result of the synthetic material according to Example 1.

The X-ray diffraction pattern of the synthetic material of FIG. 4 matched with the X-ray pattern calculated from the $SrLi_3AlO_4$ crystal shown in FIG. 2, and it was verified that the crystal had the same crystal structure as that of the $SrLi_3AlO_4$ crystal.

For example, the peaks at 2θ=15.92 degrees, 38.02 degrees, 36.20 degrees, 30.12 degrees, 22.64 degrees, 44.68 degrees, 66.22 degrees, 69.90 degrees, 32.18 degrees, and 57.52 degrees in FIG. 2 substantially correspond to and matches well with the peaks at 2θ=16.00 degrees, 38.12 degrees, 36.30 degrees, 30.22 degrees, 22.72 degrees, 44.78 degrees, 66.38 degrees, 70.08 degrees, 32.28 degrees, and 57.72 degrees in FIG. 4, respectively although the heights of some intensities are inverted. Here, the error of the angles of 2θ was evaluated as ±1 degree.

It was verified from the above result that the synthetic material according to Example 1 was an inorganic compound in which the $SrLi_3AlO_4$ crystal was substituted with Eu. Although not shown in the drawings, in Examples 2 to 6, the same X-ray diffraction pattern as that of Example 1 was obtained. In Examples 2 to 6, the results of the correspondence between the X-ray diffraction patterns and 10 major peaks in FIG. 2 were also the same as those of Example 1.

It was verified from the above result that the synthetic materials according to Example 1 to 6 included, as a main component, a new inorganic compound in which the $SrLi_3AlO_4$ crystal was substituted with activating ions of Eu.

TABLE 4

| | | Example 1 | Example 2 | Example 3 | Example 4 | Example 5 | Example 6 | Comparative Example 1 |
|---|---|---|---|---|---|---|---|---|
| Composition | Eu Concentration (mol %) | 1.0 | 1.0 | 1.0 | 0.1 | 0.5 | 1.0 | 1.0 |
| Firing Process Conditions | Temperature (° C.) | 800 | 825 | 800 | 800 | 800 | 800 | 800 |
| | Pressure (MPa) | 0.03 | 0.03 | 0.03 | 0.03 | 0.03 | 0.03 | 0.03 |
| | Time | 4 | 4 | 12 | 8 | 8 | 8 | 4 |
| | Atmosphere | $NH_3$ | $NH_3$ | $NH_3$ | $NH_3$ | $NH_3$ | $NH_3$ | Ar |

TABLE 4-continued

|  | Example 1 | Example 2 | Example 3 | Example 4 | Example 5 | Example 6 | Comparative Example 1 |
|---|---|---|---|---|---|---|---|
| Number of Times of Firing Process | 1 | 1 | 1 | 3 | 3 | 3 | 1 |
| Fluorescence Intensity $I_1$ at Wavelength of 617 nm | 0.17 | 0.17 | 0.16 | 0.24 | 0.18 | 0.17 | 1.19 |
| Fluorescence Intensity $I_2$ at Wavelength of 628 nm | 0.11 | 0.10 | 0.09 | 0.15 | 0.10 | 0.09 | 0.91 |
| Fluorescence Intensity $I_0$ at Wavelength of 569 nm | 1 | 1 | 1 | 1 | 0.99 | 1 | 1 |
| Fluorescence Intensity Ratio $I_1/I_0$ | 0.17 | 0.17 | 0.16 | 0.24 | 0.18 | 0.17 | 1.19 |
| Fluorescence Intensity Ratio $I_2/I_0$ | 0.11 | 0.10 | 0.09 | 0.15 | 0.10 | 0.09 | 0.91 |
| Absorptivity (%) | 56 | 65 | 59 | 56 | 73 | 73 | 27 |
| Internal Quantum Efficiency (%) | 38 | 43 | 46 | 44 | 44 | 51 | 15 |
| External Quantum Efficiency (%) | 21 | 28 | 27 | 25 | 32 | 37 | 4 |

The obtained phosphor (synthetic material) according to each of Examples and Comparative Example was evaluated based on the following evaluation items.

[Fluorescence Intensity]

Regarding the powder of the synthetic material according to each of Examples and Comparative Example, the emission spectrum was measured using a fluorescence spectrophotometer (F-7000, manufactured by Hitachi High-Tech Corporation) according to the following procedure.

The powder of the synthetic material according to each of Examples and Comparative Example was filled into a cell formed of a synthetic quartz having a high transmissivity in an ultraviolet range to visible range. The cell filled with the powder sample was set in a predetermined position of the fluorescence spectrophotometer, and was irradiated with monochromatic light having a wavelength of 260 nm from a light-emitting source (Xe lamp) to measure the emission spectrum. The slit width on the excitation side was set to 10.0 nm and the slit width on the emission side was set to 5.0 nm to measure the emission spectrum. In addition, in order to remove the influence of high-order excitation light on the emission spectrum, a cut filter (filter that absorbs light having a wavelength of 290 nm or shorter) was used. Based on the obtained emission spectrum, the fluorescence intensity ($I_1$) at a wavelength of 617 nm and the emission intensity ($I_2$) at a wavelength of 628 nm were calculated with respect to 1 as the fluorescence intensity (I0) at a wavelength of 569 nm. The fluorescence intensity ratio $I_1/I_0$ and the fluorescence intensity ratio $I_2/I_0$ are shown in Table 4.

[Emission Characteristics]

Regarding the powder of the synthetic material according to each of Examples and Comparative Example, the absorptivity, the internal quantum efficiency, and the external quantum efficiency were calculated using a multi-channel spectrometer (MCPD-7000, manufactured by Otsuka Electronics Co., Ltd.) according to the following procedure.

The powder of the synthetic material according to each of Examples and Comparative Example was filled into a recessed cell such that the surface of the recessed cell was smooth, and was attached to a predetermined position of an integrating sphere. Monochromatic light having a wavelength of 455 nm emitted from a light-emitting source (Xe lamp) was introduced into the integrating sphere using optical fibers. The sample of the phosphor was irradiated with this monochromatic light as the excitation source to measure the fluorescence spectrum of the sample.

A standard reflective plate (SPECTRALON, manufactured by Labsphere) having a reflectivity of 99% was attached to the sample portion to measure the spectrum of the excitation light having a wavelength of 455 nm. At this time, the number of excitation light photons (Qex) was calculated from the spectrum in a wavelength range of 450 to 465 nm.

The powder of each of the synthetic materials was attached to the sample portion and was irradiated with excitation light having a wavelength of 455 nm to obtain spectral data. Based on the spectral data, the number of reflected excitation reflected light photons (Qref) and the number of fluorescence photons (Qem) were calculated. The number of excitation reflected light photons was calculated in the same wavelength range as that of the number of excitation light photons, and the number of fluorescence photons was calculated in a wavelength range of 465 to 800 nm.

Absorptivity=$(Qex-Qref)/Qex \times 100$

Internal Quantum Efficiency=$(Qem/(Qex-Qref)) \times 100$

External Quantum Efficiency=$(Qem/Qex) \times 100$

When a standard sample NSG 1301 available from Sialon Co., Ltd. was measured using the measurement method, the external quantum efficiency was 55.6% and the internal quantum efficiency was 74.8%. The device was corrected with reference to this sample.

Table 4 shows the results obtained regarding the absorptivity, the internal quantum efficiency, and the external quantum efficiency. As shown in Table 4, it was verified that, in the phosphor according to each of Examples, the absorptivity, the internal quantum efficiency, and the external quantum efficiency were improved as compared to the phosphor according to Comparative Example 1.

The present application claims priority based on Japanese Patent Application No. 2019-118166 filed on Jun. 26, 2019, the entire content of which is incorporated herein by reference.

REFERENCE SIGNS LIST

1: oxygen atom
2: strontium atom
3: $AlO_4$ tetrahedron (central Al atom)
4: $LiO_4$ tetrahedron (central Li atom)
11: surface-mounted white light-emitting diode lamp
12, 13: lead wire
14: blue light-emitting diode element
15: bonding wire
16: first resin
17: phosphor
18: second resin
19: alumina ceramic substrate
20: wall surface member

The invention claimed is:

1. A phosphor in which at least some of an element M in a phosphor host crystal represented by $M_\alpha(L, A)_\beta X_\gamma$ is substituted with Eu, in both $Eu^{3+}$ and $Eu^{2+}$ states, as an activation material, the phosphor having a composition represented by Formula: $M_\alpha(L, A)_\beta X_\gamma:Eu_\delta$, wherein M represents one or more elements (including at least Sr) selected from Mg, Ca, Sr, Ba, and Zn, L represents one or more elements selected from Li, Na, and K, A represents one or more elements selected from Al, Ga, B, In, Sc, Y, La, and Si, X represents one or more elements selected from O, N, F, and Cl, wherein X is not only N, $\alpha$, $\beta$, $\gamma$, and $\delta$ satisfy $8.70 \leq \alpha+\beta+\gamma+\delta \leq 9.30$, $0.00 < \alpha \leq 1.30$, $3.70 \leq \beta \leq 4.30$, $3.70 \leq \delta \leq 4.30$, and $0.00 < \delta \leq 1.30$, and in a fluorescence spectrum obtained by irradiation with light having a wavelength of 260 nm, when a fluorescence intensity at a wavelength of 569 nm is represented by $I_0$ and a fluorescence intensity at a wavelength of 617 nm is represented by $I_1$, a fluorescence intensity ratio $I_1/I_0$ is 0.01 or more and 0.4 or less, wherein the phosphor is powdery such that, when an average particle size corresponding to a cumulative value of 50% in a volume frequency particle size distribution measured using a laser diffraction scattering method is represented by d50, d50 is from 0.1 μm or more to 50 μm or less.

2. The phosphor according to claim 1,
wherein in the fluorescence spectrum, when an emission intensity at a wavelength of 628 nm is represented by $I_2$, a fluorescence intensity ratio $I_2/I_0$ is 0.01 or more and 0.3 or less.

3. The phosphor according to claim 1,
wherein the phosphor is represented by a compositional formula $Sr_e Li_f Al_g O_{h1} N_{h2} Eu_i$, compositional proportions e, f, g, h1, h2, and i satisfy $e+f+g+h1+h2+i=9$, $0.00 < e < 1.30$, $0.70 \leq f \leq 3.30$, $0.70 \leq g \leq 3.30$, $3.70 \leq h1+h2 \leq 4.30$ (where $h1>0$), $0.00 < i < 1.30$, and $0.70 \leq e+i \leq 1.30$.

4. The phosphor according to claim 3,
wherein the compositional proportions f and g satisfy $7/40 \leq g/(f+g) < 30/40$.

5. The phosphor according to claim 3,
wherein the compositional proportions h1 and h2 satisfy $0 < h1/(h1+h2) \leq 1$.

6. The phosphor according to claim 1,
wherein by irradiation with light having a light intensity peak in a wavelength range of 250 nm or longer and 500 nm or shorter, fluorescence having a light intensity peak in a wavelength range of 430 nm or longer and 670 nm or shorter is emitted.

7. The phosphor according to claim 6,
wherein by irradiation with light having a light intensity peak in the wavelength range of 250 nm or longer and 500 nm or shorter, fluorescence having a light intensity peak in a wavelength range of 560 nm or longer and 580 nm or shorter is emitted.

8. A method of producing a phosphor having a composition including at least one element M selected from the group consisting of Mg, Ca, Sr, Ba, and Zn, at least one element L selected from the group consisting of Li, Na, and K, at least one element A selected from the group consisting of Al, Ga, B, In, Sc, Y, La, and Si, at least one element X selected from the group consisting of O, N, F, and Cl, and Eu, wherein X is not only N, the method comprising:

a mixing step of obtaining a raw material mixture including respective elements forming the composition; and a firing step of firing the raw material mixture such that at least some of $Eu^{3+}$ in the raw material mixture is reduced into $Eu^{2+}$, wherein in a fluorescence spectrum obtained by irradiation with light having a wavelength of 260 nm, when a fluorescence intensity at a wavelength of 569 nm is represented by $I_0$ and a fluorescence intensity at a wavelength of 617 nm is represented by $I_1$, a fluorescence intensity ratio $I_1/I_0$ is 0.01 or more and 0.4 or less, and wherein the firing step is performed in a firing atmosphere including $NH_3$.

9. A light-emitting element comprising the phosphor according to claim 1.

10. A light-emitting device comprising the light-emitting element according to claim 9.

11. An image display apparatus comprising the light-emitting element according to claim 9.

* * * * *